(12) United States Patent
Jacobs

(10) Patent No.: US 6,373,310 B1
(45) Date of Patent: Apr. 16, 2002

(54) SCALABLE SET/RESET CIRCUIT WITH IMPROVED RISE/FALL MISMATCH

(75) Inventor: Jason P. Jacobs, San Francisco, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/703,988

(22) Filed: Oct. 27, 2000

(51) Int. Cl.[7] .......................... H03K 3/12; H03K 3/037; H03K 3/286; H03K 3/356
(52) U.S. Cl. ...................... 327/217; 327/219; 327/215; 327/225; 327/218
(58) Field of Search ................................ 327/199, 200, 327/202, 208, 210–215, 217, 218, 219, 225, 333, 54, 55, 57; 326/68, 81, 73

(56) References Cited

U.S. PATENT DOCUMENTS

| | | | | |
|---|---|---|---|---|
| 4,980,577 A | * | 12/1990 | Baxter | 327/217 |
| 5,124,568 A | * | 6/1992 | Chen et al. | 327/217 |
| 5,241,225 A | * | 8/1993 | Okajima et al. | 326/73 |
| 5,528,181 A | * | 6/1996 | Suggs | 327/217 |
| 5,793,236 A | * | 8/1998 | Kosco | 327/218 |
| 6,011,421 A | * | 1/2000 | Jung | 327/219 |
| 6,147,514 A | * | 11/2000 | Shiratake | 327/55 |
| 6,232,810 B1 | * | 5/2001 | Oklobdzija et al. | 327/217 |

* cited by examiner

Primary Examiner—Terry D. Cunningham
Assistant Examiner—Long Nguyen
(74) Attorney, Agent, or Firm—Blakely, Sokoloff, Taylor & Zafman LLP

(57) ABSTRACT

A multiple input set/reset circuit is described that includes cross-coupled inverters connected between set and reset nodes. The set/reset circuit also includes at least one set input circuit coupled to the set node configured to receive a set signal and to drive the set node to a first logic state in response to the set signal asserted, and at least one reset input circuit coupled to the reset node configured to receive a reset signal and drive the reset node to the first logic state in response to the reset signal asserted. Incorporated into the set/reset circuit are a first switching circuit to change the logic state of one of the nodes to a second logic state when the other node changes the logic state to the first logic state, and a second switching circuit to disable the first switching circuit after the first and second nodes have completed a logical state change in response to a set or reset signal asserted.

21 Claims, 6 Drawing Sheets

SCALABLE SET/RESET CIRCUIT WITH IMPROVED RISE/FALL MISMATCH

BACKGROUND OF THE INVENTION

1. Field of the Invention

The present invention generally relates to electronic circuits, and in particular, to set/reset circuits.

2. Description of the Related Art

A conventional set/reset circuit 100 is shown in FIG. 1, formed by using a pair of cross-coupled NAND gates 102, 104. Alternatively, a pair of cross-coupled NOR gates could have been used. While the circuit 100 may be adequate for supporting a single pair of set and reset input terminals 106, 108, extending this configuration for multiple input pairs would be undesirable. Adding inputs to the circuit 100 would require either stacking transistors in series or using cascaded logic gates, both of which degrade timing performance.

FIG. 2 depicts a schematic diagram of a scalable set/reset circuit 200 formed with cross-coupled inverters 210 to hold the logical state at nodes NSET and NRESET when none of set signal (S0, S1, S2) or reset signal (R0, R1, R2) is asserted. The scalable set/reset circuit 200 includes one set of pull-down transistors 206 coupled to NSET and another set of pull-down transistors 208 coupled to NRESET. Each of the pull-down transistors Q1 through Q6 is stronger than the cross-coupled inverters 210 and is able to overcome the relatively weak inverters 202, 204 to pull a corresponding node (NSET or NRESET) to logical low state.

FIG. 3 depicts a timing diagram for the scalable set/reset circuit 200 shown in FIG. 2, illustrating set and reset operations of the circuit. The output Q of the circuit is initially in a logical low state and the other output Q# is initially in a logical high state. At time T1, a set signal S0 goes high, this low-to-high transition signal asserted to the gate of transistor Q1 turns on the transistor Q1 and pulls the node NSET low at time T2 and the output signal Q high at time T3. The logic low at the node NSET provides logic high at the node NRESET, through inverter 202, at time T4. When NRESET goes high, this causes output Q# to go from high to low at time T5. From time T5 to T6, when neither the set nor reset signal is asserted, the cross-coupled inverters 210 function to hold the state of NSET and NRESET until a reset signal is applied. At T6, a reset signal R0 is applied to the gate of transistor Q2 which causes the transistor Q2 to pull NRESET low at T7 and the output Q# high at time T8. When the logical state of NRESET go from high to low, the inverter 204 will charge the node NSET to high.

While the set/reset circuit 200 of FIG. 2 has an advantage over the circuit 100 of FIG. 1 in that adding a pair of set and reset input terminals only requires the addition of a single pair of transistors to the node NSET and NRESET, one problem associated with the circuit shown in FIG. 2 is that the rise and fall times of the outputs Q and Q# are asymmetric. The rise and fall times of the outputs Q and Q# are inherently mismatched because the cross-coupled inverters 210 are made weaker than the pull-down transistors Q1–Q6 to enable the transistors to overcome the cross-coupled inverters to pull the corresponding node to logical low state. When setting the circuit 200, NSET is pulled low relatively quickly by means of one of the pull-down transistors Q1, Q3, Q5 coupled to NSET. Thus, the low-to-high transition of output Q, in response to a set signal asserted to the gate of one of the pull-down transistors, is relatively quick. When resetting the circuit 200, the node NRESET is pulled low via one of the pull-down transistors Q2, Q4, Q6. This high-to-low transition of NRESET drives the node NSET high through the inverter 202. Because the inverter 202 is a slower device than the pull-down transistors Q2, Q4 or Q6, it will take a while longer to charge the node NSET to high. In this regard, NSET is pulled low much faster than it can be pulled high. This results in the fall time of output Q being greater than the rise time of output Q. This mismatch in rise and fall time of the output can cause problems in applications requiring relatively symmetric rise and fall times of output.

DETAILED DESCRIPTION OF THE INVENTION

Implementations of the present invention are described herein for purposes of illustration, namely a multiple input set/reset (MISR) circuit. According to one aspect of the present invention, the MISR circuit has less variation between the rise and fall times of the output than a conventional multiple input set/reset circuit design. Accordingly, the MISR circuit is particularly useful in applications requiring relatively symmetric rise and fall time of the output. According to another aspect of the present invention, the MISR circuit is more scalable than a conventional set/reset circuit design in that the MISR circuit of the invention has a low timing penalty per additional pair of set and reset inputs added to the circuit. It should be noted that the term "transistor" in the context of the present invention is used to describe a switching element, including N-channel or P-channel MOS-FETs, FETs, JFETs, BJTs or the like.

Figure 4:
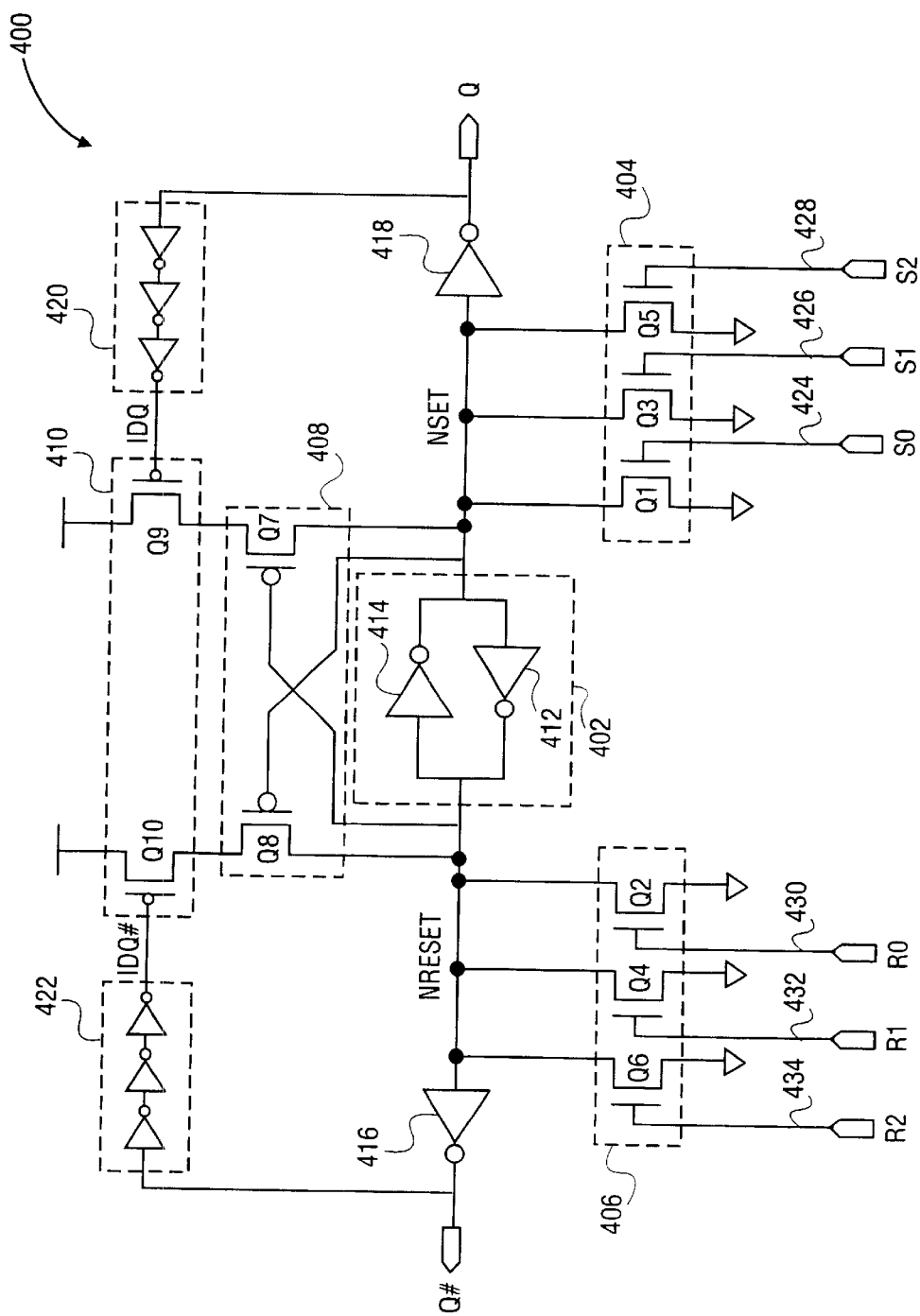
FIG. 4 is a schematic diagram of a multiple input set/reset circuit according to one embodiment of the present invention.

FIG. 4 depicts a schematic diagram of a multiple input set/reset (MISR) circuit 400 according to one embodiment of the present invention. The MISR circuit 400 generally includes a set node (NSET), a reset node (NRESET), cross-coupled inverters 402 coupled between NSET and NRESET, a first set of pull-down (N-channel) transistors 404 coupled to NSET, a second set of pull-down (N-channel) transistors 406 coupled to NRESET, a first switching circuit 408 and a second switching circuit 410. Although in the illustrated embodiment, six transistors Q1 through Q6 are shown, it should be noted the MISR circuit 400 is scalable and can be implemented with different number of transistors (e.g., 2, 3, 4, etc.).

Also included in the MISR circuit 400 are a number of set terminals 424, 426, 428 coupled to the gate of the transistors Q1, Q3, Q5 to receive a set signal S0, S1, S2, respectively, and a number of reset terminals 430, 432, 434 coupled to the gate of the transistors Q2, Q4, Q6 to receive a reset signal R0, R1, R2, respectively. Also, the logical state at nodes NSET and NRESET are inverted and buffered to provided output signals Q and Q#, respectively. The cross-coupled inverters 402 maintain the logical state at NSET and NRESET, when neither of set nor reset signal is asserted, by preventing NSET and NRESET from drifting to another logical state. In this regard, the cross-coupled inverters 402 are preferably strong enough to withstand any leakage current present within the circuit and need to be stronger than any capacitive coupled noise sources in the circuit. However, the cross-coupled inverters 402 must be weaker than the pull-down transistors Q1 through Q6 so as to enable each pull-down transistor to overcome the inverters 412, 414 to pull the corresponding node (NSET and NRESET) to logical low state. Because cross-coupled inverters 402 are formed with relatively weak inverters 412, 414, the low-to-high transition of NRESET driven by the inverter 412 in response to NSET changing state from high to low tends to be slow. Similarly, the low-to-high transition of NSET driven by the weak inverter 414 in response to NRESET changing state to low also tends to be slow. While stronger inverters 412, 414 could have been used to speed up the rise time of NSET and NRESET caused by the other node changing state from high to low, the pull-down transistors must also increase in size to overcome the strength of the inverters to pull the node to logical low state.

To reduce rise time of NSET and NRESET caused by the other node changing state without having to increase the size of the inverters 412, 414, a first switching circuit 408 (referred hereinafter as "pull-up circuit") is incorporated into the MISR circuit 400. In one embodiment, the pull-up circuit 408 is implemented by a pair of pull-up (p-channel) transistors Q7, Q8. The first pull-up transistor Q7 has its gate connected to NRESET to pull the NSET high in response to NRESET changing state from high to low. Similarly, the gate of the second pull-up transistor Q8 is connected to NSET to pull the NRESET high in response to NSET changing state from high to low.

The pull-up transistors Q7, Q8 of the pull-up circuit 408 are preferably as strong as the pull-down transistors Q1–Q6 in order to balance the output rise and fall times. However, the presence of the strong pull-up transistors Q7, Q8 interferes with the ability of the pull-down transistors Q1–Q6 to change the state of nodes (NSET or NRESET). Since the pull-up circuit 408 is only needed during a logical state transition, a second switching circuit 410 (referred hereinafter as "enable circuit") is incorporated into the MISR circuit 400. In one embodiment, the enable circuit 410 is formed with a pair of enable (P-channel) transistors Q9, Q10 added in series with the pull-up transistors Q7, Q8. Specifically, the gate of the first enable transistor Q9 is coupled to the output Q, while the source is coupled to the supply line of the circuit and the drain is coupled to the source of the pull-up transistor Q7. Similarly, the gate of the second enable transistor Q10 is coupled to the output Q#, while the source is coupled to the supply line of the circuit and the drain is coupled to the source of the pull-up transistor Q8. Accordingly, the enable transistors Q9, Q10 are controlled by the outputs of the MISR circuit 400 to disable the pull-up circuit 408 once the MISR circuit has completed a logical state change.

To ensure that the MISR circuit 400 has completed a logical state change before disabling the pull-up circuit, inverting delay chains 420, 422 are incorporated into the feedback path of the enable transistors Q9, Q10 which function to delay and invert the outputs Q, Q# before the signal is inputted to the gate of the enable transistors Q9, Q10, respectively. Each inverting delay chain 420, 422 comprises an odd number of inverters (e.g., 1, 3, 5, etc.) that are sized weak to provide a proper delay. In other words, the window of time during which the pull-up circuit 408 is enabled can be increased or decreased by selecting a proper delay provided by the inverting delay chain 420, 422.

Figure 5:
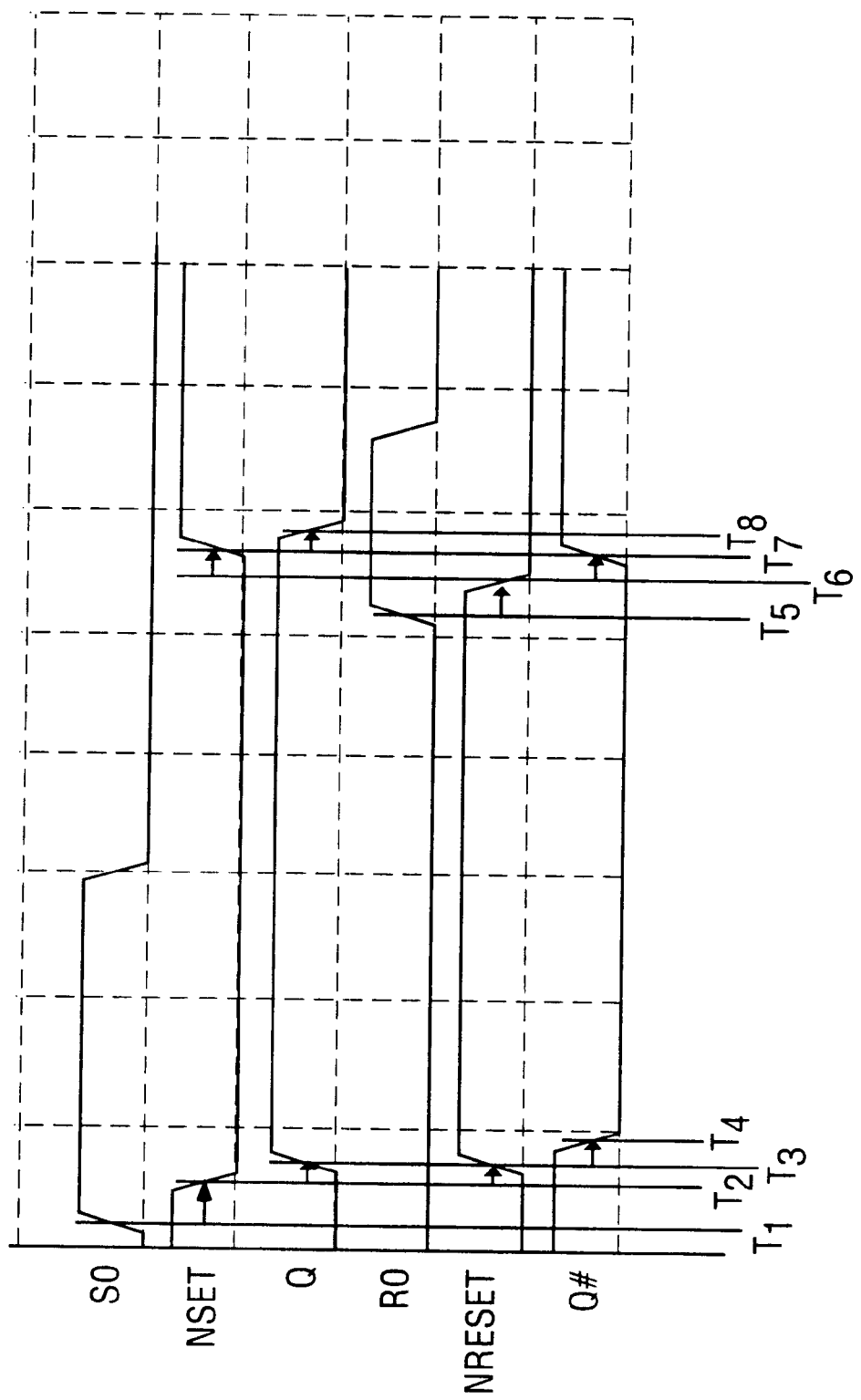
FIG. 5 is a timing diagram of the multiple input set/reset circuit of FIG. 4.

The operation of the MISR circuit 400 of FIG. 4 will be described in more detail with reference to the timing diagram shown in FIG. 5. Assume that one output Q is initially in a logical low state and the other output Q# is initially in a logical high state. At time T1, a set signal S0 goes high, this low-to-high transition asserted to the gate of the transistor Q1 turns it on, causing the logical state at NSET to go from high to low at time T2. At time T3, the logical state of NSET is inverted and buffered to provide output signal Q. Thus, when NSET goes low at time T2, the inverter 418 will drive the output Q high at time T3. When NSET goes high to low, the logical low state is transferred to the gate of pull-up transistor Q8, causing the transistor Q8 to pull the node NRESET high at time T3. When NRESET goes high, the inverter 416 drives the output Q# low at time T4. A short time later, the inverted delayed output Q# signal (IDQ#) drives the gate of the enable transistor Q10 high to turn off the transistor Q10 and disable the pull-up transistor Q8.

Between t5 and t6, when neither the set nor reset signal is asserted, the cross-coupled inverters 402 will hold the state of the nodes NSET and NRESET until a reset signal is applied. When a reset signal R0 is applied to the gate of transistor Q2 at time T5, the transistor Q2 will discharge the node NRESET to logic low at time T6, changing Q# output from low to high at time T7. When NRESET goes high to low, the logical low state is transferred to the gate of pull-up transistor Q7, causing the transistor Q7 to turn to pull the node NSET high. When NSET goes high, the inverter 418 drives the output Q low. Short time later, the inverted delayed output Q signal (IDQ) drives the gate of the enable transistor Q9 high to turn off the transistor Q9 and disable the pull-up transistor Q7.

Figure 1:
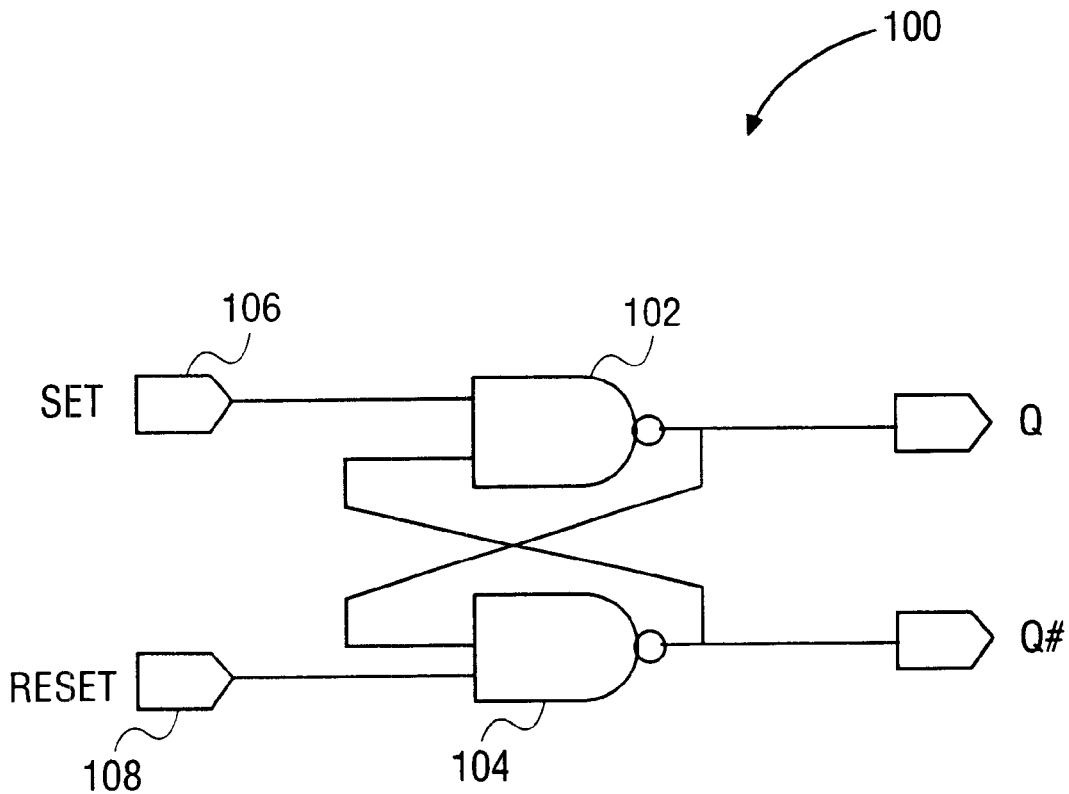
FIG. 1 is a schematic diagram of one example of a conventional set/reset circuit.
Figure 2:
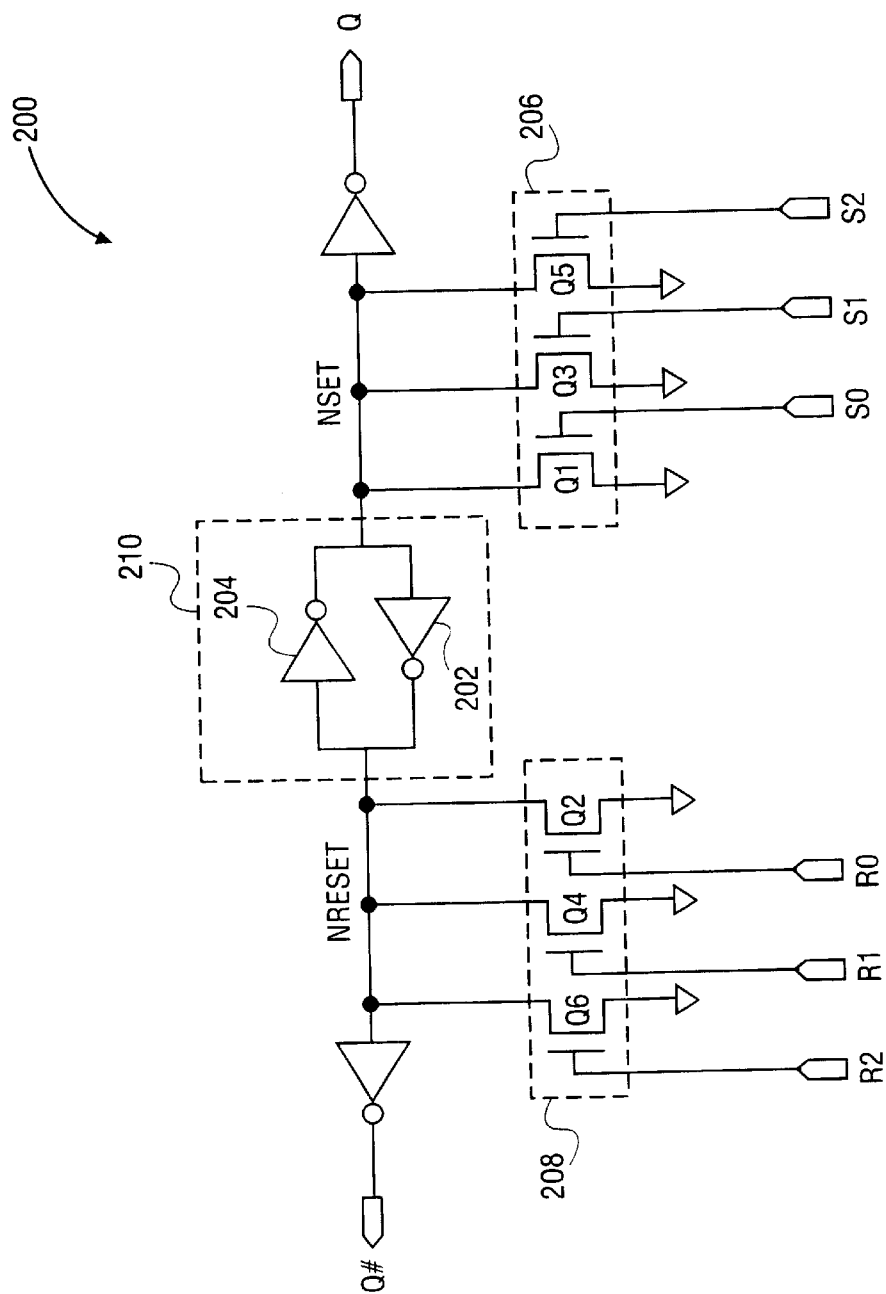
FIG. 2 is a schematic diagram of another example of a conventional set/reset circuit.
Figure 3:
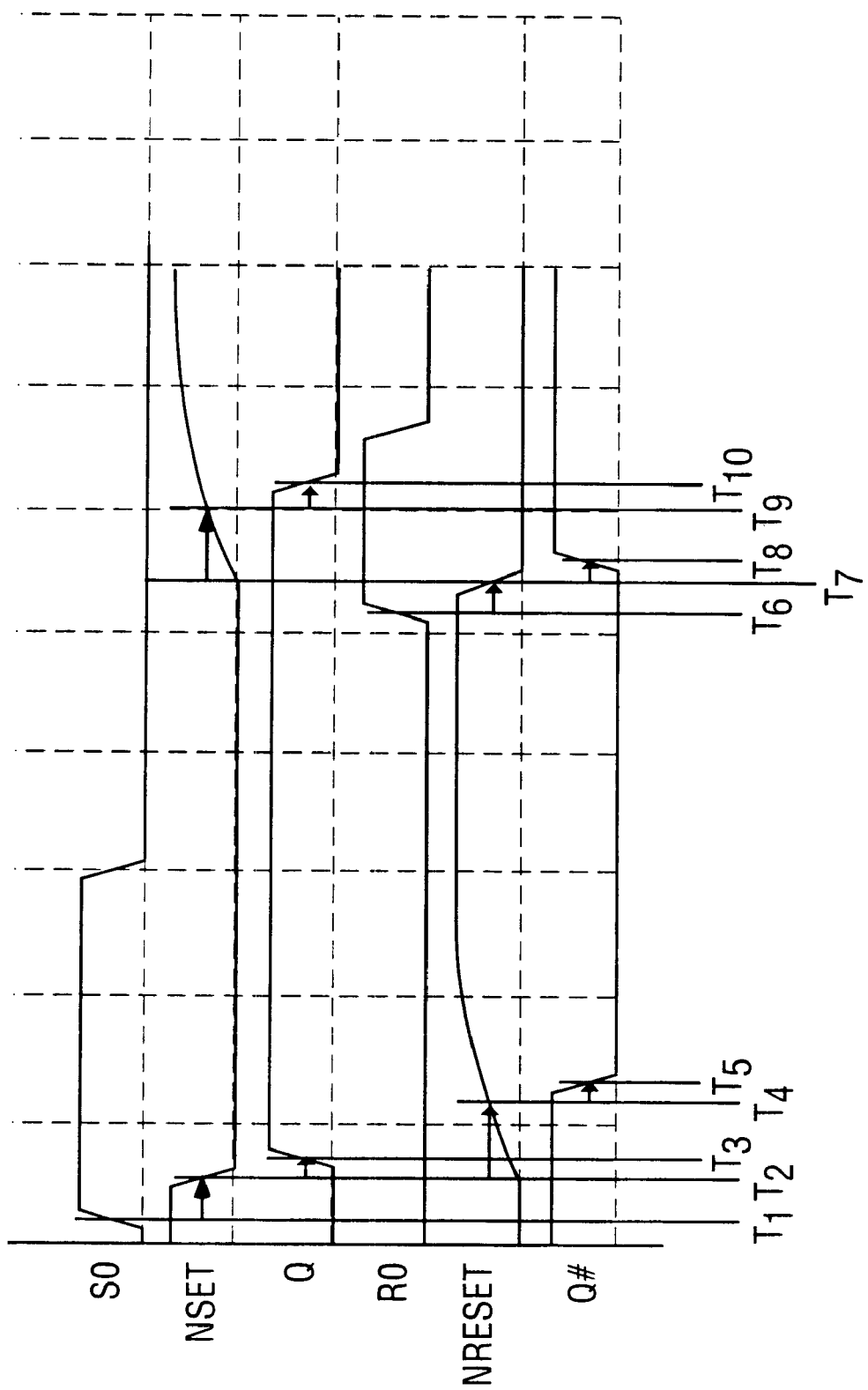
FIG. 3 is a timing diagram of the convention set/reset circuit of FIG. 2.

According to one aspect of the invention, the MISR circuit 400 is particularly useful in applications requiring relatively symmetric rise and fall times of the output signal since the rise-fall mismatch of the set/reset circuit shown in FIG. 2 is improved by adding strong pull-up transistor Q7, Q8. The addition of the pull-up circuit and the disable circuit allows the fall time of outputs Q to closely match the rise time of output Q. In context of the present invention, the term "rise time of output Q" is used to describe the time it takes to change the output signal Q to high after a set signal is asserted (e.g., from t1 to t3 in FIG. 5). Likewise, the term "fall time of output Q" is used to describe the time it takes to change the output signal Q to low after a reset signal is asserted (e.g., from t5 to t7 in FIG. 5).

According to another aspect of the present invention, the MISR circuit 400 is more scalable than conventional set/reset circuit designs. Adding inputs to conventional CMOS gates requires either stacking transistors in series or using cascaded logic gates, both of which degrade timing performance. The MISR circuit of the invention has the advantage that adding a pair set and reset inputs only requires addition of a single pair of transistors to the terminals of the cross-coupled inverters. While the parasitic drain capacitance degrades the overall speed of the circuit, the delay is the same for every input. Furthermore, the loads seen by the parallel transistors are identical and the output timing will not be a function of which input is asserted.

Figure 6:
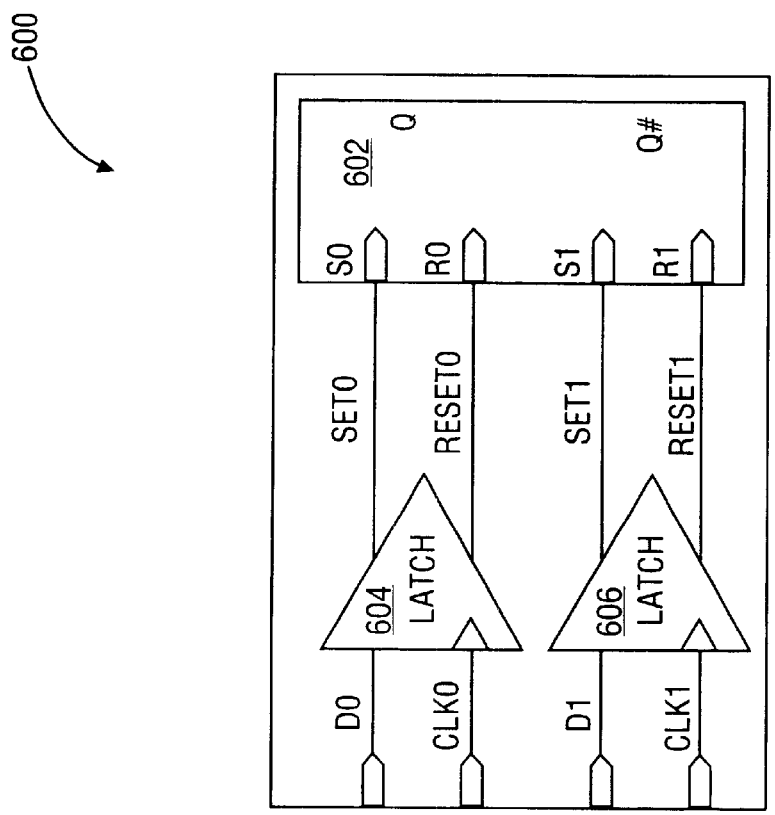
FIG. 6 is a block diagram of a multiple input flip-flop according to one embodiment of the present invention.

FIG. 6 depicts a multiple input flip-flop 600 according to one embodiment of the present invention. In accordance with a further aspect of the present invention, the multiple input set/reset circuit 400 of FIG. 4 is used to construct the multiple input flip-flop 602 shown in FIG. 6. In the illustrated embodiment, two data input terminals D0, D1 and two clock input terminals CK0, CK1 are shown; however, it will be understood by those skilled in the art that the illustrated flip-flop can be easily modified to facilitate additional data and clock input terminals. In one implementation, the output Q of the flip-flop 600 changes state to match the data input D0, D1 on an active transitional edge (e.g., rising or falling edge) of its associated clock input CK1, CK2, respectively. The multiple input flip-flop 600 comprises two master latches 604, 606 and a slave multiple input set/reset circuit 602 of the present invention. Each latch 604, 606 are configured such that either a set or reset output SET0, SET1, RESET0, RESET1 is asserted while the enable to the latch 604, 606 is active, depending on the logical state of its data input D0, D1. The illustrated MISR circuit 602 has four input terminals S0, R0, S1, R1 to receive two pair of set and reset input signals from both master latches 604, 606; however, other configurations are possible. In one implementation, the multiple input set/reset circuit 602 requires that only one of the latch enables (i.e., clock inputs) be asserted at any time.

While the foregoing embodiments of the invention have been described and shown, it is understood that variations and modifications, such as those suggested and others within the spirit and scope of the invention, may occur to those skilled in the art to which the invention pertains. For example, although the description of the illustrated embodiment makes specific references to N-channel, P-channel, pull-up and pull-down transistors, it should be noted that a working dual of the invention could be constructed by replacing every N-channel with a P-channel transistor, Vcc with Vss, and vice-versa. In this case the set/reset signal polarity would be negative, requiring a low signal to set the gate, for example. The scope of the present invention accordingly is to be defined as set forth in the appended claims.

What is claimed is:

1. A multiple input set/reset circuit comprising: cross-coupled inverters coupled between first and second nodes; at least one first input circuit coupled to said first node to receive a plurality of first input signals, wherein said at least one first input circuit drive: said first node to a first logic state when at least one of said plurality of said first input signals is asserted;

at least one second input circuit coupled to said second node to receive plurality of second input signals wherein said at least one second input circuit drives said second node to said first logic state when at least one of said plurality of said second input signals is asserted;

a first switching circuit to change the logic state of one of said first and second nodes in response to the other node changing logic state; and a second switching circuit to disable the first switching circuit after said first and second nodes have completed a logical state change in response to one of said plurality first and second input signals asserted.

2. The circuit of claim 1, wherein said first node is a set node, said second node is a reset node.

3. The circuit of claim 2, wherein said at least one first input circuit comprises a plurality of transistors and a plurality of set input terminals, each set input terminal coupled to a gate of a respective transistor to receive one of said plurality of first input signals.

4. The circuit of claim 2, wherein said at least one second input circuit comprises a plurality of transistors and a plurality of reset input terminals, each reset input terminal coupled to a gate of a respective one of said transistors to receive one of said plurality of second input signals.

5. The circuit of claim 1, further comprising a first output terminal coupled to said first node to output a first output signal and a second output terminal to said second node to output a second output signal.

6. The circuit of claim 1, wherein said at least one first input circuit comprises an N-channel transistor and said at least one second input circuit comprises an N-channel transistor.

7. The circuit of claim 5, wherein said first switching circuit comprises first and second pull-up transistors, the gate of the first pull-up transistor coupled to the second node to pull the first node to a second logic state in response to the second node changing state from the second logic state to the first logic state, and the gate of the second pull-up transistor coupled to the first node to pull the second node to the second logic state in response to the first node changing state from the second logic state to the first logic state.

8. The circuit of claim 7, wherein said second switching circuit comprises first and second enable transistors, the gate of the first enable transistor is coupled to receive said first output signal, while the source is coupled to a supply line and the drain is coupled to the source of the first pull-up transistor, and the gate of the second enable transistor is coupled to receive said second output signal, while the source is coupled to a supply line and the drain is coupled to the source of the second pull-up transistor.

9. The circuit of claim 8, wherein each of said first and second enable transistors comprises a P-channel transistor and each of said first and second pull-up transistors comprises a P-channel transistor.

10. The circuit of claim 8, wherein the length of time during which one of said pull-up transistors is enabled is selected by selecting a delay provided by a delay circuit incorporated into feedback paths of said enable transistors.

11. The circuit of claim 1, wherein said cross-coupled inverters are used to maintain logical state of the first and second nodes when none of first and second input signal is asserted.

12. A flip-flop comprising:

first and second data input terminals;

first and second clock input terminals;

a first latch coupled to receive input signals from said first data input terminal and said first clock input terminal and asserts either a first set signal or a first reset signal in response to an active transitional edge of input signal received from said first clock input terminal, depending on a logical state of input signal received from said first data input terminal;

a second latch coupled to receive input signals from said second data input terminal and said second clock input terminal and asserts either a second set signal or a second reset signal in response to an active transitional edge of input signal received from said second clock input terminal, depending on a logical state of input signal received from said second data input terminal; and a multiple input set/reset circuit comprising;

cross-coupled inverters coupled between set and reset nodes, first and second set input circuits coupled to receive said first and second set signals, respectively, wherein said first and second set input circuits drive said set node to a first logic state when one of said set signals is asserted, first and second reset input circuits coupled to receive said first and second reset signals, respectively, wherein said first and second reset input circuits drive said reset node to said first logic state when one of said reset signals is asserted, a first switching circuit to change the logic state of one of said set or reset nodes in response to the other node changing logic state, and a second switching circuit to disable the first switching circuit after said set and reset nodes have completed a logical state change in response to one of said set and reset signals asserted.

13. The flip-flop of claim 11, further comprising a first output terminal coupled to said set node to output a first output signal and a second output terminal to said reset node to output a second output signal.

14. A multiple input set/reset circuit comprising:

set input means coupled to a set node for receiving a set signal and driving said set node to a first logic state in response to said set signal asserted, said set input means including a plurality of set input terminals;

reset input means coupled to a reset node for receiving a reset signal and driving said reset node to said first logic state in response to said reset signal asserted, said reset input means including a plurality of reset input terminals;

means for maintaining logical state of said set node and said reset node when none of set or reset signal is asserted;

means for changing the logic state of one of said set or reset nodes in response to the other node changing logic state; and means for disabling said means for changing the logic state after said set and reset nodes have completed a logical state change in response to one of said set and reset signals asserted.

15. The multiple input set/reset circuit of claim 14, further comprising first output means coupled to said set node for outputting a first output signal, and second output means coupled to said reset node for outputting a second output signal.

16. The multiple input set/reset circuit of claim 14, wherein said set input means comprises a plurality of pull-down transistors and a plurality of set input terminals, each set input terminal coupled to a gate of a respective pull-down transistor to receive a set signal.

17. The multiple input set/reset circuit of claim 14, wherein said reset input means comprises a plurality of pull-down transistor and a plurality of reset input terminals, each reset input terminal coupled to a gate of a respective pull-down transistor to receive a reset signal.

18. The multiple input set/reset circuit of claim 14, wherein said means for changing comprises first and second pull-up transistors, the gate of the first pull-up transistor coupled to the reset node to pull the set node to a second logic state in response to the reset node changing state from the second logic state to the first logic state, and the gate of the second pull-up transistor coupled to the set node to pull the reset node to the second logic state in response to the set node changing state from the second logic state to the first logic state.

19. The multiple input set/reset circuit of claim 18, wherein said means for disabling comprises first and second enable transistors, the gate of the first enable transistor is coupled to receive said first output signal, while the source is coupled to a supply line and the drain is coupled to the source of the first pull-up transistor, and the gate of the second enable transistor is coupled to receive said second output signal, while the source is coupled to a supply line and the drain is coupled to the source of the second pull-up transistor.

20. The multiple input set/reset circuit of claim 19, wherein the length of time during which one of said pull-up transistors is enabled is determined by a delay provided by a delay circuit incorporated into feedback paths of said enable transistors.

21. The multiple input set/reset circuit of claim 14, wherein said means for maintaining logical state of the set and reset nodes comprises cross-coupled inverters coupled between the set and reset nodes.

* * * * *

UNITED STATES PATENT AND TRADEMARK OFFICE
CERTIFICATE OF CORRECTION

PATENT NO. : 6,373,310 B1
DATED : April 16, 2002
INVENTOR(S) : Jacobs

It is certified that error appears in the above-identified patent and that said Letters Patent is hereby corrected as shown below:

Column 5,
Line 58, delete "plurality first" and insert -- plurality of first --.

Signed and Sealed this

Nineteenth Day of November, 2002

Attest:

Attesting Officer

JAMES E. ROGAN
Director of the United States Patent and Trademark Office